(12) United States Patent
Greenhill et al.

(10) Patent No.: US 8,269,544 B2
(45) Date of Patent: Sep. 18, 2012

(54) POWER-SUPPLY NOISE SUPPRESSION USING A FREQUENCY-LOCKED LOOP

(75) Inventors: David J. Greenhill, Portola Valley, CA (US); Robert P. Masleid, Monte Sereno, CA (US); Georgios K. Konstadinidis, San Jose, CA (US); King C. Yen, San Jose, CA (US); Sebastian Turullols, Los Altos, CA (US)

(73) Assignee: Oracle America, Inc., Redwood Shores, CA (US)

( * ) Notice: Subject to any disclaimer, the term of this patent is extended or adjusted under 35 U.S.C. 154(b) by 175 days.

(21) Appl. No.: 12/896,650

(22) Filed: Oct. 1, 2010

(65) Prior Publication Data

US 2012/0081157 A1    Apr. 5, 2012

(51) Int. Cl.
*H03H 11/26* (2006.01)
(52) U.S. Cl. ......... 327/262; 327/291; 327/292; 713/322
(58) Field of Classification Search .................. 327/262, 327/291, 292; 713/300, 320, 321, 322
See application file for complete search history.

(56) References Cited

U.S. PATENT DOCUMENTS

| | | | |
|---|---|---|---|
| 7,330,081 B1 * | 2/2008 | Asa et al. ........................ | 331/57 |
| 7,342,460 B2 * | 3/2008 | Batchelor et al. ............... | 331/16 |
| 7,777,576 B2 * | 8/2010 | Waheed et al. .................. | 331/17 |
| 7,884,660 B2 * | 2/2011 | Delage et al. .................. | 327/270 |
| 8,154,335 B2 * | 4/2012 | Chawla et al. ................. | 327/544 |
| 2011/0068841 A1 * | 3/2011 | Huang et al. .................. | 327/156 |
| 2011/0068858 A1 * | 3/2011 | Chawla et al. ................. | 327/538 |
| 2011/0148676 A1 * | 6/2011 | Waheed et al. ................ | 341/131 |
| 2011/0187428 A1 * | 8/2011 | Kashmiri et al. ............... | 327/159 |
| 2012/0044005 A1 * | 2/2012 | Chawla et al. ................. | 327/299 |
| 2012/0081157 A1 * | 4/2012 | Greenhill et al. .............. | 327/155 |

* cited by examiner

*Primary Examiner* — Lincoln Donovan
*Assistant Examiner* — Adam Houston
(74) *Attorney, Agent, or Firm* — Park, Vaughan, Fleming & Dowler LLP; Steven E. Stupp (57) ABSTRACT

An integrated circuit that includes a digitally controlled oscillator (DCO) that adjusts a clock frequency of a critical path of the integrated circuit based on the variations in a power-supply voltage of the DCO and the critical path is described. This DCO may be included in a feedback control loop that includes a frequency-locked loop (FLL), and which determines an average clock frequency of the critical path based on a reference frequency. Furthermore, the DCO may have a selectable delay characteristic that specifies a delay sensitivity of the DCO as a function of the power-supply voltage, thereby approximately matching a manufactured delay characteristic of the critical path. Additionally, for variations in the power-supply voltage having frequencies greater than a resonance frequency associated with a chip package of the integrated circuit, adjustments of the clock frequency may be proportional to the variations in the power-supply voltage and the selectable delay characteristic.

20 Claims, 8 Drawing Sheets

┌─────────────────────────────────────────────────────────────────────┐
│ RECEIVE A SELECTABLE DELAY CHARACTERISTIC THAT SPECIFIES THE         │
│ DELAY SENSITIVITY OF A *DCO* AS A FUNCTION OF A POWER-SUPPLY         │
│ VOLTAGE, WHERE THE POWER-SUPPLY VOLTAGE PROVIDES POWER TO            │
│ THE *DCO* AND A TIME CRITICAL PATH OF AN INTEGRATED CIRCUIT, AND THE │
│ SELECTABLE DELAY CHARACTERISTIC APPROXIMATELY MATCHES A              │
│ MANUFACTURED DELAY CHARACTERISTIC OF THE TIME CRITICAL PATH          │
│ 810                                                                  │
└─────────────────────────────────────────────────────────────────────┘
                                    ↓
┌─────────────────────────────────────────────────────────────────────┐
│ FOR VARIATIONS IN THE POWER-SUPPLY VOLTAGE HAVING FREQUENCIES        │
│ GREATER THAN THE RESONANCE FREQUENCY OF A CHIP PACKAGE OF THE        │
│ INTEGRATED CIRCUIT, THE *DCO* ADJUSTS THE CLOCK FREQUENCY IN         │
│ PROPORTION TO THE VARIATIONS IN THE POWER-SUPPLY VOLTAGE AND         │
│ THE SELECTABLE DELAY CHARACTERISTIC                                  │
│ 812                                                                  │
└─────────────────────────────────────────────────────────────────────┘

FIG. 8

POWER-SUPPLY NOISE SUPPRESSION USING A FREQUENCY-LOCKED LOOP

BACKGROUND

1. Field

The present disclosure generally relates to an integrated circuit with an adjustable clock frequency. More specifically, the present disclosure relates to an integrated circuit that includes a digitally controlled oscillator (DCO) that adjusts a clock frequency of a critical path based on variations in a power-supply voltage of the DCO and the critical path.

2. Related Art

The operating frequency of an integrated circuit is typically specified at the lowest acceptable power-supply voltage (Vlow) for a critical path in the integrated circuit, i.e., the power-supply voltage for which the critical path has a non-zero timing margin. In addition, the power dissipation or power consumption of the integrated circuit is usually specified at the average power-supply voltage (Vnominal).

In general, clock-generating circuits on integrated circuits are designed to be stable and not to track variations in the power-supply voltage, such as changes associated with power-supply noise. Thus, ideally there is a fixed difference between Vnominal and Vlow during operation of the integrated circuit.

However, in practice the power-supply voltage usually decreases when there is an increase in the power consumption of the integrated circuit. In particular, when there is a transient increase in the power-supply current, the inductance (L) through a chip package of the integrated circuit can result in a voltage loss $$\left(L\frac{di}{dt}\right).$$

This voltage loss can result in a failure on the critical path because of an insufficient timing margin caused by the drooped voltage.

Figure 1:
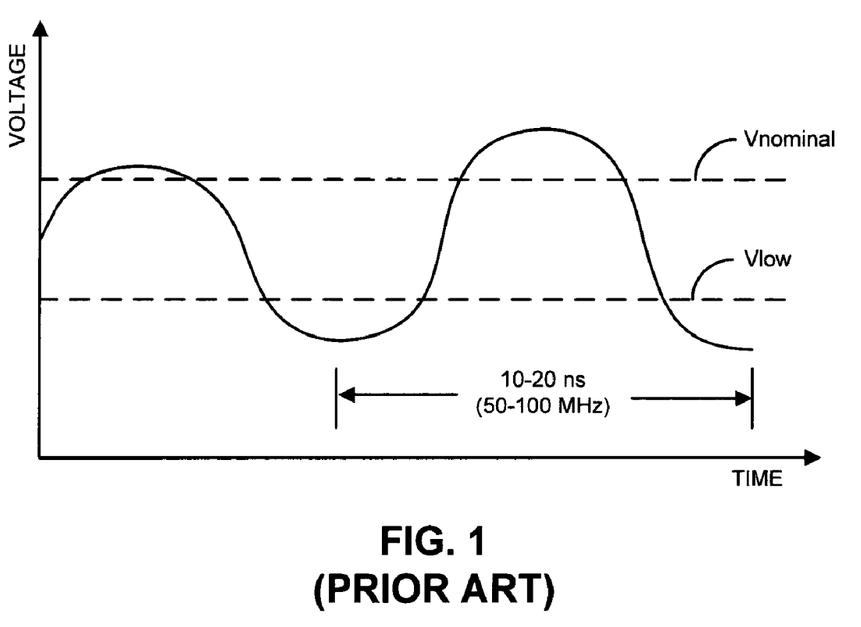
FIG. 1 is a drawing illustrating an electronic resonance associated with a chip package of an existing integrated circuit.

In addition, the combination of the inductance L and on-chip capacitances can produce a resonance frequency between 50-100 MHz that also produces oscillations in the power-supply voltage. This is shown in FIG. 1, which illustrates an electronic resonance associated with the chip package of an existing integrated circuit. Note that, if the power-supply voltage drops below Vlow, the critical path in this integrated circuit may fail because of an insufficient timing margin.

As critical dimensions in integrated circuits continue to decrease, the sensitivity of integrated circuits to these power-supply effects increases. Notably, smaller critical dimensions are typically associated with higher clock frequencies (and smaller clock periods), which increases power consumption and, thus, increases voltage droop. Furthermore, as the clock frequency increases, the resonance frequency associated with the chip package may fall within the operating bandwidth of the integrated circuit and, thus, of the power-supply distribution system. (However, note that the voltage variations associated with this resonance are typically at too high a frequency to be addressed by a voltage regulator module in the power-supply distribution system.) Collectively, these effects may require additional voltage margin to be added when designing the integrated circuit to ensure proper operation, which may be prohibitive in terms of the cost, complexity and time to market of the integrated circuit.

Hence, what is needed is an integrated circuit without the above-described problems.

SUMMARY

One embodiment of the present disclosure provides an integrated circuit that adjusts a clock frequency. In particular, this integrated circuit includes a digitally controlled oscillator (DCO) that adjusts the clock frequency of a critical path of the integrated circuit based on the variations in a power-supply voltage of the DCO and the critical path. This DCO has a selectable delay characteristic that specifies a delay sensitivity of the DCO as a function of the power-supply voltage, thereby approximately matching a manufactured delay characteristic of the critical path. Furthermore, for variations in the power-supply voltage having frequencies greater than a resonance frequency associated with a chip package of the integrated circuit, adjustments of the clock frequency are proportional to the variations in the power-supply voltage and the selectable delay characteristic.

In some embodiments, the selectable delay sensitivity is between a delay characteristic associated with a gate-dominated critical path and a delay characteristic associated with a wire-dominated critical path.

Moreover, a response time of the DCO to the variations in the power-supply voltage may be approximately less than or equal to a response time of the critical path to the variations in the power-supply voltage. In some embodiments, a response time of the DCO to the variations in the power-supply voltage may be approximately less than a quarter of a period corresponding to the resonance frequency.

Note that variations in the power-supply voltage may be associated with an inductance of the chip package and a time-varying power-supply current.

Additionally, the integrated circuit may include a feedback control loop that determines an average clock frequency of the critical path based on a reference frequency, where the feedback control loop has an operating frequency that is less than the resonance frequency. This feedback control loop may include a frequency-locked loop (FLL). Moreover, the FLL may not lock a phase of a clock output by the DCO and hence may operate independently of the DCO. In some embodiments, the integrated circuit includes a synchronizer circuit at a time-domain boundary in the integrated circuit that synchronizes signals crossing the time-domain boundary with a phase of a clock in a destination time domain.

Furthermore, a size of a negative adjustment to a clock period corresponding to the clock frequency, which reduces the clock period, may be deterministic and selectable. Alternatively or additionally, a size of a negative adjustment to a clock period corresponding to the clock frequency: may be restricted to a minimum DCO step size; and/or may be allowed a selectable number of clock cycles after a previous negative adjustment to the clock period. Note that every DCO has a minimum step size which is associated with a change in the least significant bit of a control input to the DCO.

Another embodiment provides an electronic device that includes the integrated circuit.

Another embodiment provides a method for adjusting the clock frequency of the integrated circuit. During operation, the integrated circuit receives the selectable delay characteristic that specifies the delay sensitivity of the DCO as a function of the power-supply voltage. This power-supply voltage provides power to the DCO and the critical path of the integrated circuit, and the selectable delay characteristic approximately matches the manufactured delay characteristic of the critical path. Then, for variations in the power-supply voltage having frequencies greater than the resonance frequency associated with the chip package of the integrated circuit, the DCO adjusts the clock frequency in proportion to the variations in the power-supply voltage and the selectable delay characteristic.

Table 1 provides a comparison of the power-supply-voltage delay sensitivities of wire-dominated and gate-dominated critical paths in an integrated circuit.

Note that like reference numerals refer to corresponding parts throughout the drawings. Moreover, multiple instances of the same part are designated by a common prefix separated from an instance number by a dash.

DETAILED DESCRIPTION

Embodiments of an integrated circuit, an electronic device that includes the integrated circuit, and a method for adjusting a clock frequency of the integrated circuit are described. In the integrated circuit, a digitally controlled oscillator (DCO) adjusts the clock frequency of a critical path of the integrated circuit based on the variations in a power-supply voltage of the DCO and the critical path. For example, the DCO may be included in a feedback control loop that includes a frequency-locked loop (FLL), and which determines an average clock frequency of the critical path based on a reference frequency. Furthermore, the DCO may have a selectable delay characteristic (such as a delay characteristic associated with a gate-dominated critical path and/or a delay characteristic associated with a wire-dominated critical path) that specifies a delay sensitivity of the DCO as a function of the power-supply voltage, thereby approximately matching a manufactured delay characteristic of the critical path. Additionally, for variations in the power-supply voltage having frequencies greater than a resonance frequency associated with a chip package of the integrated circuit, adjustments of the clock frequency may be proportional to the variations in the power-supply voltage and the selectable delay characteristic.

By adjusting the clock frequency, this integrated circuit may compensate for power-consumption-induced power-supply voltage changes. In particular, the clock frequency may be reduced when the power-supply voltage droops because of increased power consumption, thereby slowing the integrated circuit down and preventing failure of the critical path because of insufficient evaluation time at the drooped power-supply voltage. Furthermore, by slowing the integrated circuit down, this clock-frequency adjustment technique may reduce the power consumption, thereby reducing the droop in the power-supply voltage. (In effect, the timing and voltage margins of the integrated circuit may be increased.) In addition, in embodiments that include the FLL, the response time and lock time can be decreased, and loop bandwidth can be increased, which allows coverage of a much wider range of power-supply voltage droop with reduced latency. Collectively, relative to existing integrated circuits, the clock-frequency adjustment technique may reduce the cost, complexity and time to market of the integrated circuit, as well as improve its performance.

Figure 2:
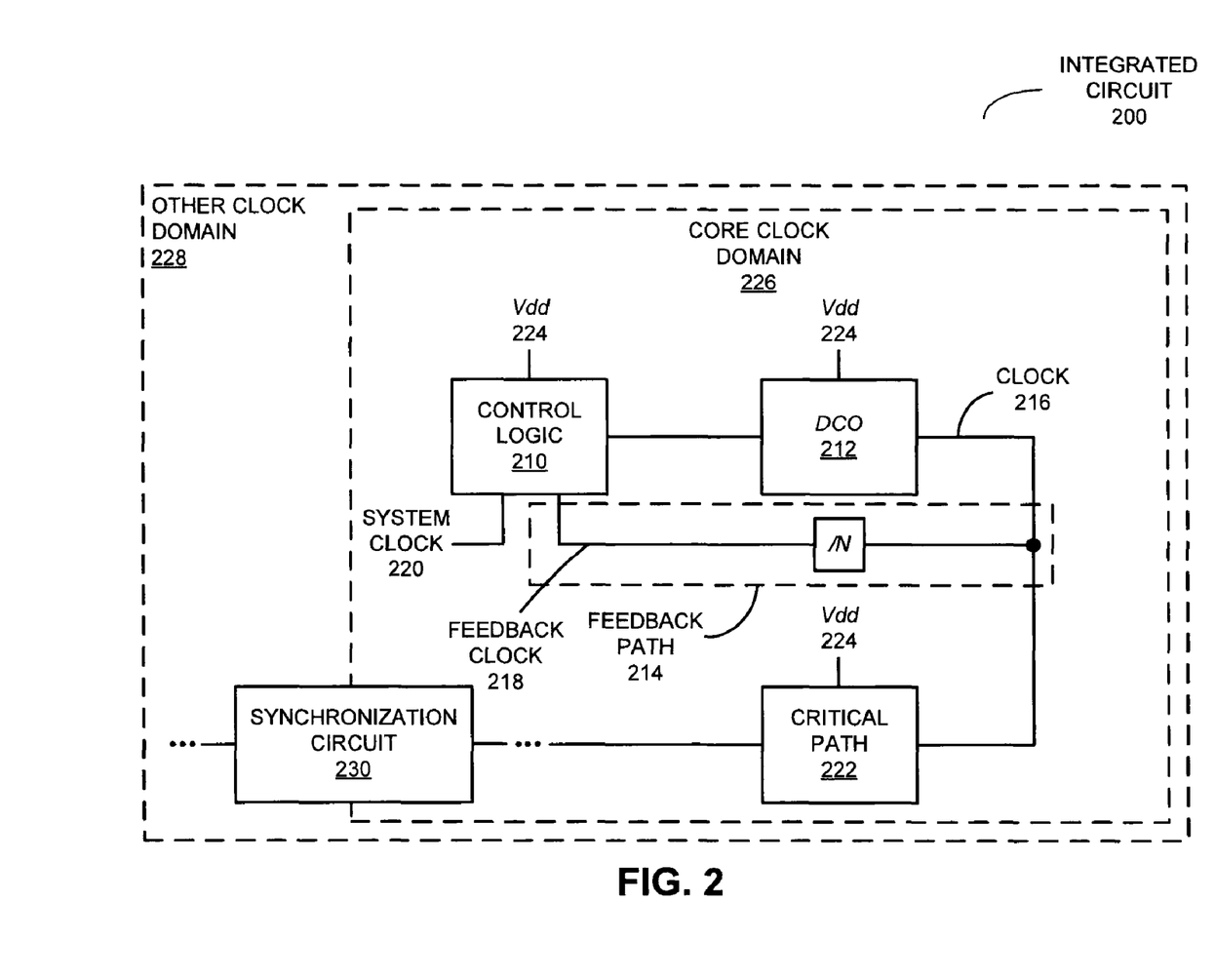
FIG. 2 is a block diagram illustrating an integrated circuit in accordance with an embodiment of the present disclosure.

We now describe embodiments of the integrated circuit. FIG. 2 presents a block diagram illustrating an integrated circuit 200. This integrated circuit includes a DCO 212 that adjusts a clock frequency of a clock 216 of a global clock-distribution tree, which includes critical path 222 of integrated circuit 200, based on the variations in a power-supply voltage (Vdd) 224 of DCO 212 and critical path 222. (Note that power-supply voltage 224 is provided by a power-distribution system, which is not shown.) These adjustments are facilitated by control logic 210 and feedback path 214. In particular, control logic 210 provides control inputs or signals to DCO 212 that specify the clock frequency based on a comparison of a frequency of a feedback clock 218 and a frequency of a system clock 220 (such as 133 MHz) or, more generally, a reference clock. For example, as described further below with reference to FIG. 3, control logic 210 may provide capacitor-control codes to DCO 212 so that the frequency of feedback clock 218 and the frequency of system clock 220 are locked even in the event of changes to power-supply voltage 224, such as power-supply-voltage changes associated with a resonance frequency associated with the integrated circuit's chip package and/or a time-varying power-supply current (e.g., power-supply voltage droop). In integrated circuit 200, note that the clock frequency of clock 216 may be determined or calculated at Vnominal (instead of at Vlow). In addition, note that critical path 222 can be a half-clock-cycle critical path or a full-clock-cycle critical path.

As described further below with reference to FIG. 4, in some embodiments control logic 210, DCO 212 and feedback path 214 (which are sometimes collectively referred to as a 'feedback control loop') constitute an FLL that tracks power-supply voltage 224 (i.e., the on-chip power supply). This FLL may be an all-digital clock generator that improves clock jitter and timing margins in response to power-supply variations (thus, the FLL may also improve power-supply margins). For example, as described further below with respect to FIG. 3, using DCO 212 the FLL may be designed so as to match the power-supply sensitivities (e.g., the time-delay sensitivity versus the power-supply voltage) of one or more critical paths (such as critical path 222) in integrated circuit 200. Thus, in response to power-supply noise, the FLL clock may slow down as much as critical path 222 does. Note that the FLL may frequency lock clock 216 (or feedback clock 218) and system clock 220 (while allowing the phase error to increase up to 360°) using digital counters that accumulate the total number of clock cycles of clock 216 and system clock 220 during a time interval (such as a clock period of system clock 220). In this way, the FLL may determine the average clock frequency of critical path 222 based on system clock 220.

In some embodiments, the FLL is the frequency generator for a core clock domain 226 in integrated circuit 200 (which may include processor cores and L3 memory). Other portions of integrated circuit 200, such as a serializer/deserializer, input/output circuits, or a system-on-chip, may be in another clock domain 228. These portions of integrated circuit 200 may be less sensitive to power-supply voltage droop because their power consumption may involve a steady current. Synchronizing of signals between core clock domain 226 and other clock domain 228 may be obtained using synchronizer circuit 230 at a time-domain boundary (or time-domain crossing) between these clock domains. (In particular, synchronizer circuit 230 may synchronize the signals crossing the time-domain boundary with a phase of a clock in the destination time domain.) Note that, because there is an asynchronous boundary between core clock domain 226 and other clock domain 228, phase locking of clock 216 (or feedback clock 218) and system clock 220 may not be needed in integrated circuit 200, which may allow the FLL to be used.

Furthermore, the feedback control loop in integrated circuit 200 may have an operating frequency that is less than the resonance frequency associated with the chip package (thus, the operating frequency may be less than or equal to 50-100 MHz). Because DCO 212 is powered exclusively by the same power-supply voltage 224 as critical path 222, variations in the instantaneous power-supply voltage will modulate the clock frequency. These changes to the clock frequency occur quickly (within a few clock cycles so there is no timing failure in critical path 222), and are subsequently slowly adjusted at the operating frequency by the FLL to match system clock 220. In this way, the period of clock 216 tracks the power-supply-induced variation in the delay through critical path 222, thereby reducing or eliminating the impact of the resonance frequency and/or power-supply voltage droop. For example, when power-supply voltage 224 droops, DCO 212 may run more slowly. The slower clock may prevent critical path 222 from failing. In addition, slowing down also reduces the power consumption, thereby reducing the power-supply voltage droop. Alternatively, when power-supply voltage 224 overshoots, DCO 212 runs faster, thereby giving correction in the other direction. On average (such as over a micro-second), the clock frequency matches that of system clock 220, but it can move around to track the oscillations in power-supply voltage 224 associated with the resonance frequency.

Note that the clock frequency of integrated circuit 200 at a given power-supply voltage increases because all circuits run as fast as the instantaneous power-supply voltage permits. Furthermore, power-supply variation is decreased because circuit activity increases at high instantaneous power-supply voltages and decreases at low instantaneous power-supply voltages.

As shown in Table 1, which provides a comparison of the power-supply-voltage delay sensitivities of wire-dominated and gate-dominated critical paths, depending on the nature of critical path 222 and any manufacturing process variations, the delay sensitivity can vary considerably.

TABLE 1

| Voltage | Wire-Dominated Critical Path | | Gate-Dominated Critical Path | |
| --- | --- | --- | --- | --- |
| (V) | Period (ps) | Delta (%) | Period (ps) | Delta (%) |
| 0.80 | 292 | −12 | 438 | −22 |
| 0.81 | 288 | −11 | 425 | −20 |
| 0.82 | 284 | −9 | 413 | −18 |
| 0.83 | 280 | −8 | 402 | −16 |
| 0.84 | 276 | −7 | 392 | −13 |
| 0.85 | 273 | −6 | 382 | −11 |
| 0.86 | 269 | −4 | 372 | −9 |
| 0.87 | 266 | −3 | 363 | −7 |
| 0.88 | 263 | −2 | 355 | −4 |
| 0.89 | 260 | −1 | 347 | −2 |
| 0.90 | 257 | 0 | 340 | 0 |
| 0.91 | 255 | 1 | 332 | 2 |
| 0.92 | 252 | 2 | 326 | 4 |
| 0.93 | 250 | 3 | 319 | 6 |
| 0.94 | 248 | 4 | 313 | 9 |
| 0.95 | 245 | 5 | 307 | 11 |
| 0.96 | 243 | 6 | 301 | 13 |
| 0.97 | 241 | 7 | 296 | 15 |
| 0.98 | 239 | 8 | 291 | 17 |
| 0.99 | 237 | 8 | 286 | 19 |
| 1.00 | 236 | 9 | 281 | 21 |

Figure 3:
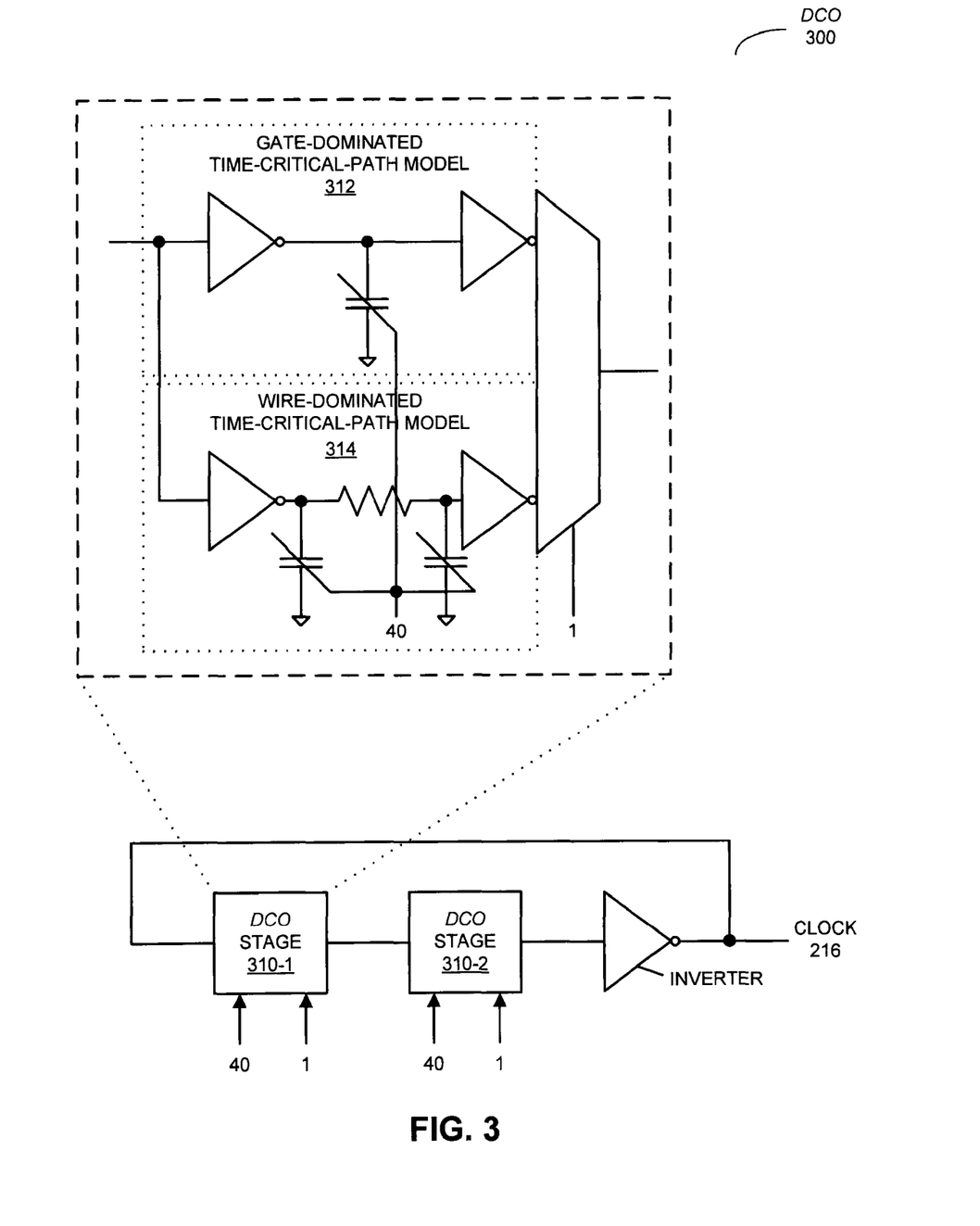
FIG. 3 is a block diagram illustrating a digitally controlled oscillator (DCO) in the integrated circuit of FIG. 2 in accordance with an embodiment of the present disclosure.

Therefore, in order to match a manufactured delay characteristic of critical path 222, in some embodiments DCO 212 is designed to track gate-dominated critical paths, wire-dominated critical paths or somewhere in between. This is shown in FIG. 3, which presents a block diagram illustrating a DCO 300, such as DCO 212 in integrated circuit 200 (FIG. 2). This DCO may include two DCO stages 310. Furthermore, DCO 300 may receive control inputs from a loop filter in control logic 210 (FIG. 2) to adjust the clock frequency of the DCO ring oscillator. These control inputs may include one or more bits for each DCO stage that specifies a gate-dominated time-critical-path model 312 (which includes one or more logic delay stages) and/or a wire-dominated time-critical-path model 314 (which includes one or more wire delay stages). Thus, these bits define the coarse control of the clock frequency to center the DCO response.

In addition, the control inputs to each DCO stage include adjustment bits that specify the behavior of the DCO ring oscillator to track the response of critical path 222 (FIG. 2) to changes in power-supply voltage 224 in FIG. 2 (and, more generally, to process and temperature variations as well). For example, the adjustment bits may specify capacitor-load values in gate-dominated time-critical-path model 312 and/or wire-dominated time-critical-path model 314 to mimic the delay and the delay versus power-supply voltage sensitivity of the manufactured critical path. In some embodiments, the adjustment bits include 40 most-significant thermometer bits and two least-significant binary bits. Furthermore, in some embodiments at least some of the adjustment bits allow DCO 300 to track a feedback response of a voltage regulator module in the power-supply distribution system.

Thus, DCO 300 may have a selectable delay characteristic that can be varied (in discrete steps) by control logic 210 (FIG. 2), which specifies a delay sensitivity of DCO 300 as a function of power-supply voltage 224 (FIG. 2), thereby approximately matching and allowing compensation for the manufactured delay characteristic of critical path 222 (FIG. 2). Furthermore, for variations in power-supply voltage 224 (FIG. 2) having frequencies greater than the resonance frequency associated with the chip package of integrated circuit 200 (FIG. 2), adjustments of the clock frequency may be proportional to the variations in power-supply voltage 224 (FIG. 2) and the selectable delay characteristic.

Figure 4:
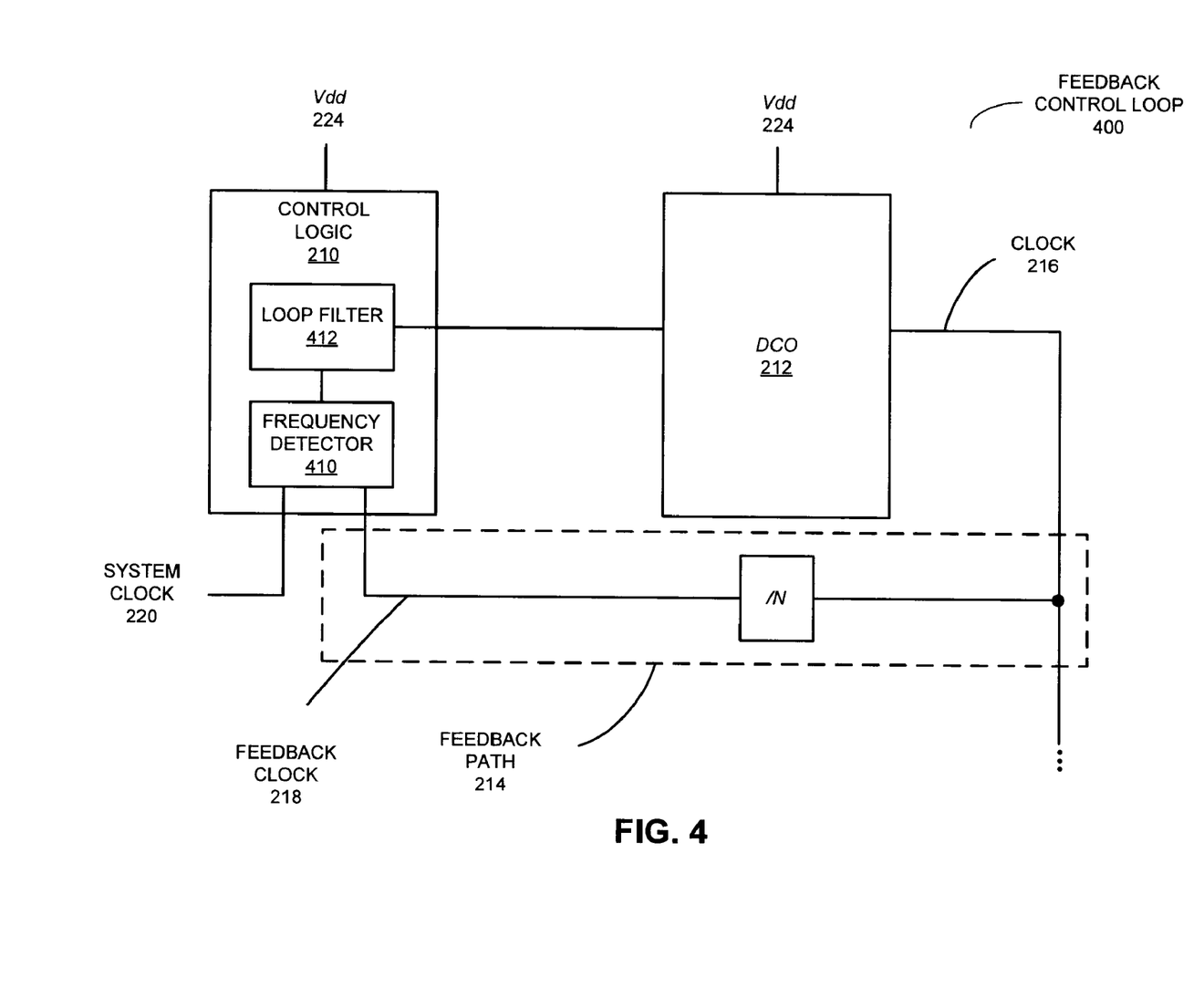
FIG. 4 is a block diagram illustrating a feedback control loop in the integrated circuit of FIG. 2 in accordance with an embodiment of the present disclosure.

FIG. 4 presents a block diagram illustrating a feedback control loop 400 in integrated circuit 200 (FIG. 2) that determines the low-frequency response of DCO 212 (such as at frequencies less than 1 MHz). In particular, feedback control loop 400 may implement an FLL. In this FLL, control logic 210 determines the frequency difference between the frequency of feedback clock 218 and the frequency of system clock 220 using a frequency detector 410 that counts how many periods of clock 216 there are in a period of system clock 220. Then, based on the determined frequency difference, loop filter 412 drives control input or signals to DCO 212 so that the average clock frequency is a multiple N (such as an integer) of the frequency of system clock 220. Note that loop filter 412 may have a transfer characteristic that approximates that of a lowpass filter with a nominal gain of 0.0341 and nominal bandwidth of 0.74 MHz. Furthermore, a bandwidth of feedback control loop 400 (and, thus, its operating frequency) may be controlled as desired in discrete binary steps by a simple digital shift of a counter output from down at the bandwidth of the voltage regulator module (approximately 10 kHz) up to the chip-package resonance frequency (50-100 MHz).

The DCO frequency (i.e., the clock frequency) is modulated at high frequencies (such as at frequencies greater than 1 MHz) by power-supply voltage 224. As noted previously, as power-supply voltage 224 increases, the clock frequency increases, and as power-supply voltage 224 decreases, the clock frequency decreases. In addition, as noted previously, the amount of modulation may be based on the programmed delay versus the power-supply voltage sensitivity of DCO 212, which may be selected to match that of manufactured critical path 222 (FIG. 2).

From an alternative perspective, the response time of DCO 212 may be faster than (i.e., less than) or approximately equal to that of critical path 222 (FIG. 2), so that it matches how critical path 222 (FIG. 2) responds to variations in power-supply voltage 224 in a clock cycle. For example, power-supply noise may move or propagate across integrated circuit 200 (FIG. 2) via the power-supply distribution system (e.g., it may be driven by the voltage regulator module through board traces) in approximately one clock cycle. DCO 212 may respond to this power-supply-voltage variation in approximately one clock cycle. Additionally, changes to the clock frequency output by DCO 212 may propagate back to critical path 222 (FIG. 2) in approximately 1-2 clock cycles.

Furthermore, typically it is desirable that the DCO response occur within a quarter of a cycle of the resonance frequency associated with the chip package (in total, some 4-5 cycles of the clock frequency, i.e., very fast). Note that locking of feedback control loop 400 may occur in a few thousand clock cycles.

As noted previously, when feedback control loop 400 makes the clock period corresponding to the clock frequency longer, no timing-margin hazard occurs because the cycle time is lengthened. However, when feedback control loop 400 makes the clock period shorter, it can change the operating frequency of integrated circuit 200 (FIG. 2). Consequently, in some embodiments the worst-case negative jitter associated with adjustments to the clock frequency by DCO 212 (i.e., reductions to the clock period) may be limited or restricted. For example, reductions to the clock period (or increases to the clock frequency) may use the smallest DCO frequency-step available, and such a change may only occur every few cycles of the clock frequency (such as between 1-10 cycles). In this way, critical path 222 (FIG. 2) may only experience at most one negative jitter step or increment per clock cycle so as to provide a deterministic maximum cycle-to-cycle negative jitter due to adjustments by DCO 212. Furthermore, if critical path 222 (FIG. 2) uses a circuit technique that involves transparent state elements or opportunistic time borrowing, then the negative jitter may be amortized over multiple clock cycles. Alternatively or additionally, a size of a negative adjustment to the clock period corresponding to the clock frequency may be allowed a selectable number of clock cycles after a previous negative adjustment to the clock period.

Thus, changes to the clock frequency, while quick, may not be large in magnitude (i.e., there may not be big jumps in the clock frequency). These small, fast changes may be better tolerated by feedback control loop 400, so that it locks on long time scales to the average clock frequency. Furthermore, there may not be too many frequency changes to the clock frequency at once, which may help reduce power-supply-voltage droop and jitter.

In embodiments where feedback control loop 400 includes an FLL, there may be a performance advantage over a phase-locked loop (PLL) at certain frequencies. In particular, a PLL locks the phase of an output to a reference (which in this case would be locking clock 216 to system clock 220). However, as a consequence the PLL may not be able to adjust to large changes, e.g., to large injected noise amplitudes. Thus, by eliminating the phase-lock requirement of a PLL, an FLL in feedback control loop 400 can eliminate the restrictions imposed by a PLL on: the response time, the lock time and the feedback-loop bandwidth. This may facilitate coverage of a much wider range of voltage droops than a PLL (which would have been forced out of phase lock). For example, an FLL may be able to withstand a 10% change in the frequency of clock 216 for a 100 mV variation in power-supply voltage 224 (which is as much as 5× larger than what can be obtained with a typical PLL).

Figure 5:
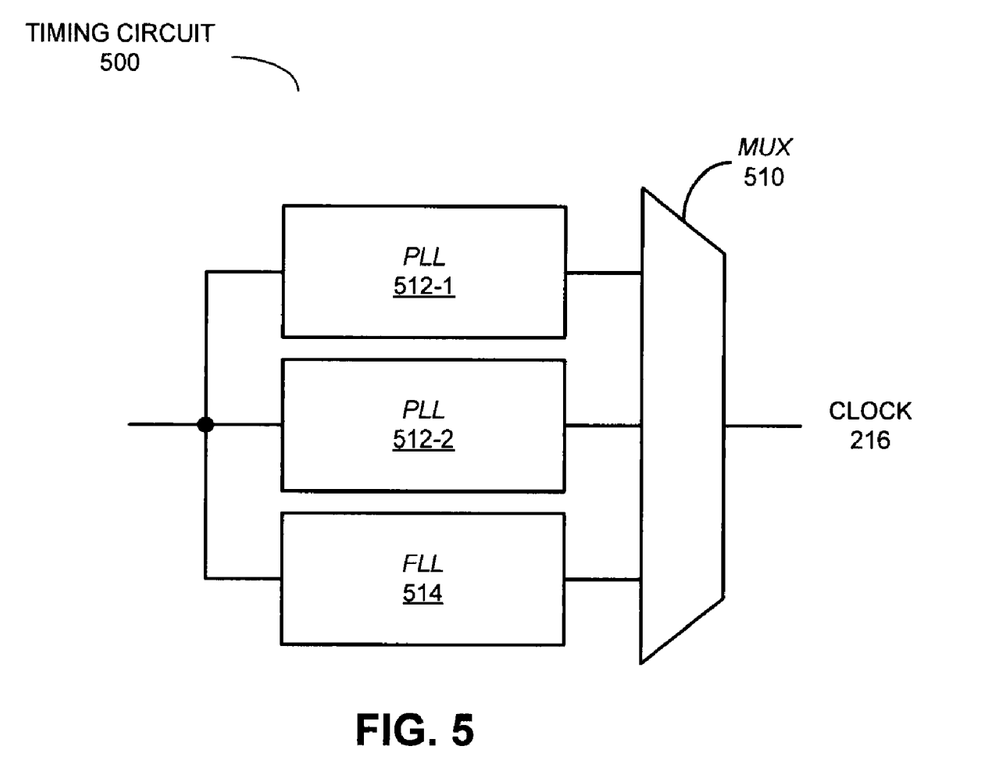
FIG. 5 is a block diagram illustrating a timing circuit in the integrated circuit of FIG. 2 in accordance with an embodiment of the present disclosure.
Figure 6:
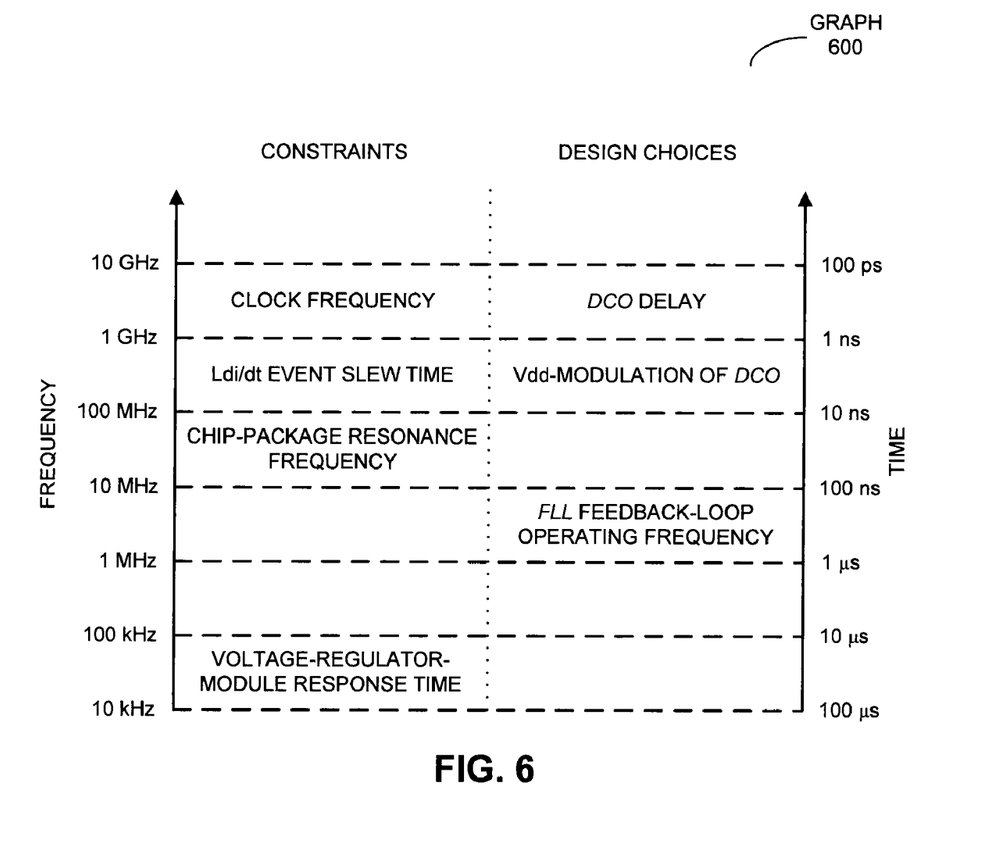
FIG. 6 is a graph illustrating constraints and design choices in the integrated circuit of FIG. 2 in accordance with an embodiment of the present disclosure.

Nonetheless, in some embodiments one or more PLLs may be used instead of an FLL in feedback control loop 400 at certain frequencies. In particular, one or more PLLs may be used at low frequencies and an FLL may be used at the highest frequencies. As shown in FIG. 5, which presents a block diagram illustrating a timing circuit 500 in integrated circuit 200 (FIG. 2), FLL or PLL feedback control may be selected based on the frequency of the power-supply variation(s) and/or the type of workload. In particular, timing circuit 500 may be included in feedback control loop 400 (FIG. 4), and the appropriate generating element (a PLL or an FLL) may be selected using multiplexer (MUX) 510. Thus, in some embodiments feedback control loop 400 (FIG. 4) includes: a PLL (such as PLL 512-1), two PLLs 512 (which are selectively switched into the feedback control loop at different frequency ranges), an FLL 514 (which typically has the best performance and noise immunity, especially for a high-speed workload), and/or all of the above components in different modes. For example, the appropriate component(s) may be selected by control logic 210 (FIGS. 2 and 4) based on the workload (frequency, power consumption, etc.). FIG. 6 presents a graph 600 illustrating constraints and design choices in integrated circuit 200 (FIG. 2) including the relationship between frequency and the power-supply-variation feedback-control system.

Figure 7:
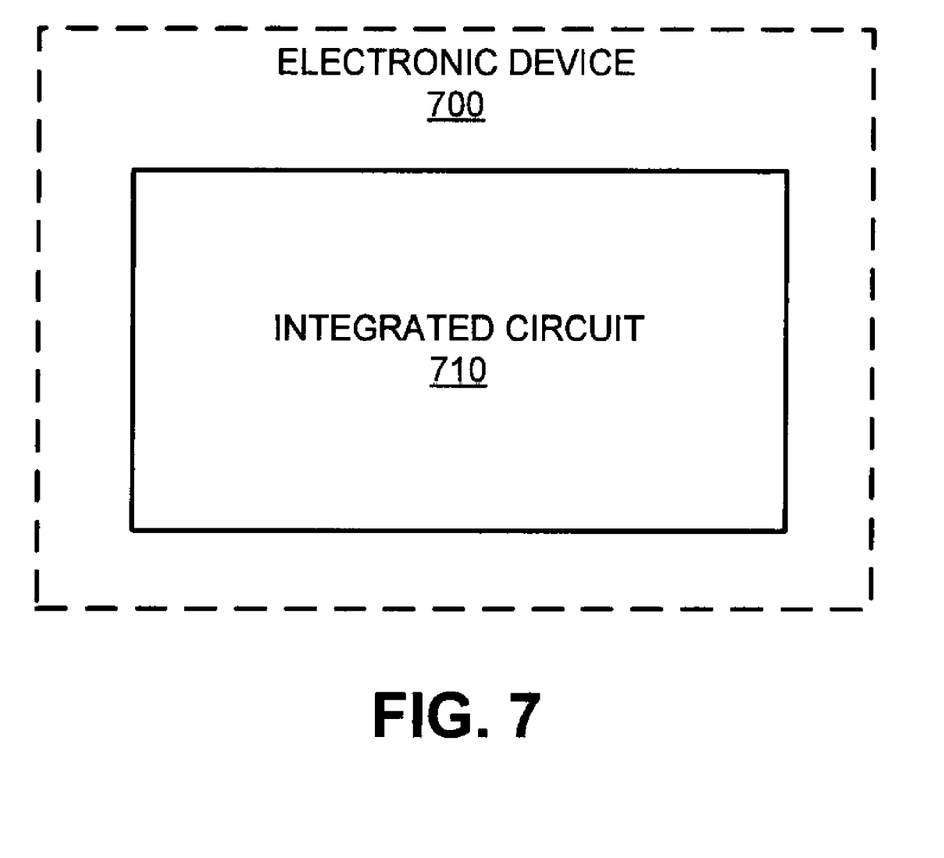
FIG. 7 is a block diagram of an electronic device that includes an integrated circuit in accordance with an embodiment of the present disclosure.

We now describe embodiments of an electronic device that includes one of the preceding embodiments of the integrated circuit, such as integrated circuit 200 (FIG. 2). FIG. 7 presents a block diagram of an electronic device 700 that includes integrated circuit 710. For example, integrated circuit 710 may include one or more processors or processor cores.

More generally, embodiments of the integrated circuit may be used in a variety of applications, including: VLSI circuits, communication systems, storage area networks, data centers, networks (such as local area networks), and/or computer systems (such as multiple-core processor computer systems). Note that electronic device 700 may include, but is not limited to: a server, a laptop computer, a communication device or system, a personal computer, a work station, a mainframe computer, a blade, an enterprise computer, a data center, a portable-computing device, a supercomputer, a network-attached-storage (NAS) system, a storage-area-network (SAN) system, and/or another electronic computing device. Moreover, note that a given computer system may be at one location or may be distributed over multiple, geographically dispersed locations.

Integrated circuit 200 (FIG. 2), DCO 300 (FIG. 3), feedback control loop 400 (FIG. 4), timing module 500 (FIG. 5) and/or electronic device 700 may include fewer components or additional components. For example, referring to FIG. 2, integrated circuit 200 may include a power-supply-voltage droop detector, which detects droop and then skips a clock cycle of clock 216 if power-supply voltage 224 is dropping too rapidly (which could cause a timing failure in critical path 222). Alternatively or additionally, integrated circuit 200 may include an analog PLL with power-supply noise injection, for example, by using a different power-supply voltage for the voltage-controlled oscillator in the PLL than power-supply voltage 224 of critical path 222, and injecting noise so that clock 216 tracks the power-supply-induced variation in critical path 222.

Although integrated circuit 200, DCO 300 (FIG. 3), feedback control loop 400 (FIG. 4), timing module 500 (FIG. 5) and/or electronic device 700 (FIG. 7) are illustrated as having a number of discrete items, these circuits and devices are intended to be functional descriptions of the various features that may be present rather than structural schematics of the embodiments described herein. Consequently, in these embodiments two or more components may be combined into a single component, and/or a position of one or more components may be changed. Furthermore, note that circuits in these embodiments may be implemented using PMOS and/or NMOS, and signals may include digital signals that have approximately discrete values and/or analog signals that have continuous values. Thus, the control inputs or signals provided to DCO 212 by control logic 210 may be digital signals and/or analog signals.

Figure 8:
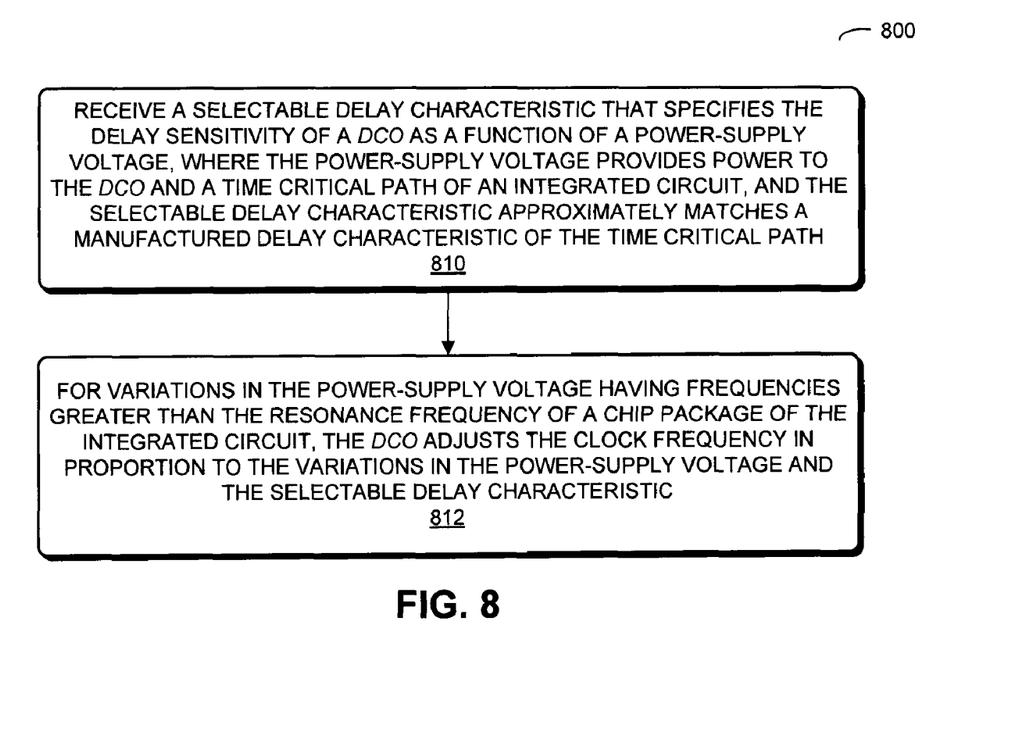
FIG. 8 is a flow chart illustrating a process for adjusting a clock frequency of an integrated circuit in accordance with an embodiment of the present disclosure.

We now describe embodiments of a process. FIG. 8 presents a flow chart illustrating a process 800 for adjusting the clock frequency of an integrated circuit, such as integrated circuit 200 (FIG. 2). During operation, the integrated circuit receives the selectable delay characteristic that specifies the delay sensitivity of the DCO as a function of the power-supply voltage (operation 810). This power-supply voltage provides power to the DCO and the critical path of the integrated circuit, and the selectable delay characteristic approximately matches the manufactured delay characteristic of the critical path. Then, for variations in the power-supply voltage having frequencies greater than the resonance frequency associated with the chip package of the integrated circuit, the DCO adjusts the clock frequency in proportion to the variations in the power-supply voltage and the selectable delay characteristic (operation 812).

In some embodiments of process 800, there are additional or fewer operations. Moreover, the order of the operations may be changed, and/or two or more operations may be combined into a single operation.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An integrated circuit, comprising:
a digitally controlled oscillator (DCO) configured to adjust a clock frequency of a critical path of the integrated circuit based on variations in a power-supply voltage of the DCO and the critical path;
wherein the DCO has a selectable delay characteristic that specifies a delay sensitivity of the DCO as a function of the power-supply voltage, thereby approximately matching a manufactured delay characteristic of the critical path; and
wherein, for variations in the power-supply voltage having frequencies greater than a resonance frequency associated with a chip package of the integrated circuit, adjustments of the clock frequency are proportional to the variations in the power-supply voltage and the selectable delay characteristic.

2. The integrated circuit of claim 1, wherein the selectable delay sensitivity is between a delay characteristic associated with a gate-dominated critical path and a delay characteristic associated with a wire-dominated critical path.

3. The integrated circuit of claim 1, wherein a response time of the DCO to the variations in the power-supply voltage is approximately less than or equal to a response time of the critical path to the variations in the power-supply voltage.

4. The integrated circuit of claim 1, wherein a response time of the DCO to the variations in the power-supply voltage is approximately less than a quarter of a period corresponding to the resonance frequency.

5. The integrated circuit of claim 1, wherein the variations in the power-supply voltage are associated with an inductance of the chip package and a time-varying power-supply current.

6. The integrated circuit of claim 1, further comprising a feedback control loop that determines an average clock frequency of the critical path based on a reference frequency, wherein the feedback control loop has an operating frequency that is less than the resonance frequency.

7. The integrated circuit of claim 6, wherein the feedback control loop includes a frequency-locked loop (FLL).

8. The integrated circuit of claim 7, wherein the FLL operates independently of a phase of a clock output by the DCO.

9. The integrated circuit of claim 8, further comprising a synchronizer circuit at a time-domain boundary in the integrated circuit, which is configured to synchronize signals crossing the time-domain boundary with a phase of a clock in a destination time domain.

10. The integrated circuit of claim 1, wherein a size of a negative adjustment to a clock period corresponding to the clock frequency, which reduces the clock period, is deterministic and selectable.

11. The integrated circuit of claim 1, wherein a size of a negative adjustment to a clock period corresponding to the clock frequency, which reduces the clock period, is restricted to a minimum DCO step size.

12. The integrated circuit of claim 1, wherein a negative adjustment to a clock period corresponding to the clock frequency, which reduces the clock period, is allowed a selectable number of clock cycles after a previous negative adjustment to the clock period.

13. An electronic device, comprising:
an integrated circuit, wherein the integrated circuit includes a DCO configured to adjust a clock frequency of a critical path of the integrated circuit based on variations in a power-supply voltage of the DCO and the critical path;
wherein the DCO has a selectable delay characteristic that specifies a delay sensitivity of the DCO as a function of the power-supply voltage, thereby approximately matching a manufactured delay characteristic of the critical path; and
wherein, for variations in the power-supply voltage having frequencies greater than a resonance frequency associated with a chip package of the integrated circuit, adjustments of the clock frequency are proportional to the variations in the power-supply voltage and the selectable delay characteristic.

14. The electronic device of claim 13, wherein the selectable delay sensitivity is between a delay characteristic associated with a gate-dominated critical path and a delay characteristic associated with a wire-dominated critical path.

15. The electronic device of claim 13, wherein a response time of the DCO to the variations in the power-supply voltage is approximately less than or equal to a response time of the critical path to the variations in the power-supply voltage.

16. The electronic device of claim 13, wherein a response time of the DCO to the variations in the power-supply voltage is approximately less than a quarter of a period corresponding to the resonance frequency.

17. The electronic device of claim 13, wherein the variations in the power-supply voltage are associated with an inductance of the chip package and a time-varying power-supply current.

18. The electronic device of claim 13, further comprising a feedback control loop that determines an average clock frequency of the critical path based on a reference frequency, wherein the feedback control loop has an operating frequency that is less than the resonance frequency.

19. The electronic device of claim 13, wherein a size of a negative adjustment to a clock period corresponding to the clock frequency, which reduces the clock period, is deterministic and selectable.

20. A method for adjusting a clock frequency of an integrated circuit, comprising:
receiving a selectable delay characteristic that specifies a delay sensitivity of a DCO as a function of a power-supply voltage, wherein the power-supply voltage provides power to the DCO and a critical path of the integrated circuit, and wherein the selectable delay characteristic approximately matches a manufactured delay characteristic of the critical path; and
for variations in the power-supply voltage having frequencies greater than a resonance frequency associated with a chip package of the integrated circuit, adjusting the clock frequency in proportion to the variations in the power-supply voltage and the selectable delay characteristic.

* * * * *